(12) United States Patent
Yamamoto et al.

(10) Patent No.: US 6,747,337 B1
(45) Date of Patent: Jun. 8, 2004

(54) SEMICONDUCTOR WAFER WITH A DICING LINE OVERLAPPING A DEFECT

(75) Inventors: Hidekazu Yamamoto, Hyogo (JP); Yasuhiro Kimura, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 220 days.

(21) Appl. No.: 09/713,339

(22) Filed: Nov. 16, 2000

(30) Foreign Application Priority Data

Mar. 3, 2000 (JP) .......................................... 2000-058997

(51) Int. Cl.⁷ ............................................ H01L 23/544
(52) U.S. Cl. ........................................ 257/620; 438/113
(58) Field of Search ............................. 438/68, 83, 50, 438/462–465, 113; 257/620, 48; 148/33.1–33.2; 428/131–136, 155; 73/799

(56) References Cited

U.S. PATENT DOCUMENTS

| 4,418,467 A | * | 12/1983 | Iwai | 148/33 |
| 4,775,085 A | * | 10/1988 | Ishizuka et al. | 225/103 |
| 4,967,229 A | * | 10/1990 | Akutagawa | 355/53 |
| 5,238,876 A | * | 8/1993 | Takeuchi et al. | 156/229 |
| 5,418,190 A | * | 5/1995 | Cholewa et al. | 438/33 |
| 5,439,723 A | * | 8/1995 | Miyashita et al. | 428/66.7 |
| 5,654,588 A | * | 8/1997 | Dasse et al. | 257/204 |
| 5,656,553 A | * | 8/1997 | Leas et al. | 438/15 |
| 6,048,747 A | * | 4/2000 | Chakrabarti et al. | 438/33 |
| 6,207,473 B1 | * | 3/2001 | Hirai et al. | 257/620 |
| 6,271,102 B1 | * | 8/2001 | Brouillette et al. | 438/113 |
| 6,284,573 B1 | * | 9/2001 | Farnworth | 438/114 |
| 6,309,910 B1 | * | 10/2001 | Haba et al. | 438/113 |
| 6,402,004 B1 | * | 6/2002 | Yoshikuni et al. | 225/2 |
| 6,515,309 B1 | * | 2/2003 | Tohyama et al. | 257/88 |
| 2001/0055856 A1 | * | 12/2001 | Tao | 438/462 |

FOREIGN PATENT DOCUMENTS

JP  6-169014  6/1994

* cited by examiner

Primary Examiner—Long Pham
Assistant Examiner—Thao X. Le
(74) Attorney, Agent, or Firm—McDermott, Will & Emery

(57) ABSTRACT

A dicing lines is placed to overlap a slip created in a wafer, so that the slip extends within the dicing line.

8 Claims, 4 Drawing Sheets

SEMICONDUCTOR WAFER WITH A DICING LINE OVERLAPPING A DEFECT

BACKGROUND OF THE INVENTION

1. Field of the Invention

The present invention relates to a semiconductor wafer and a semiconductor device (or an integrated circuit chip) formed by cutting the semiconductor wafer.

2. Description of the Background Art

A silicon substrate in the form of wafer (hereinafter, referred to simply as "silicon wafer") is generally used for manufacturing semiconductor devices (integrated circuits). In the device manufacturing process, a dislocation called "slip" may occur in the silicon wafer while it is subjected to high-temperature processing. If such a slip extends into an integrated circuit, the circuit will suffer failures like increased leakage and dielectric breakdown.

In the studies of the slips, the applicant has found that a sip is normally formed from the peripheral of the silicon wafer and extends inwards along its crystal orientation. For example, the slip tends to extend in a <110> direction in the silicon wafer of <100> surface orientation.

More specifically, the applicant has found that the formation of slip 4 is detected, as shown in FIG. 5, both at a notch 2 that is provided in the silicon wafer 1 primarily for recognition of the surface orientation of the wafer, and at a contact point 8 of silicon wafer 1 and a boat 7 that is used to secure silicon wafer 1 within a reaction chamber during the high-temperature processing.

FIGS. 6 and 7 are enlarged views of formation of slips 4 in the conventional silicon wafer 1.

As shown in FIGS. 6 and 7, a number of integrated circuits 6 are formed in silicon wafer 1, and dicing lines 5 are provided to surround the integrated circuits 6. Silicon wafer 1 is divided along dicing lines 5 into a plurality of integrated circuit chips.

In the conventional silicon wafer 1, however, integrated circuits 6 have been arranged without taking into consideration the formation of slips 4. Thus, as shown in FIGS. 6 and 7, slips 4 would extend into integrated circuits 6. This causes device failures including increased leakage and dielectric breakdown, and results in a poor yield.

SUMMARY OF THE INVENTION

The present invention is directed to solve the above-described problems. An object of the present invention is to suppress extension of a slip into an integrated circuit to improve the yield.

The semiconductor wafer according to an aspect of the present invention has a notch for recognition of crystal surface orientation, and a dicing line is aligned with a defect extending from the notch such that the dicing line overlaps the defect. A typical example of the defect is a dislocation (slip) that occurs during high-temperature processing of the wafer.

By placing the dicing line as described above, the defect such as dislocation extends within the dicing line and is prevented from extending into the integrated circuit.

The dicing line preferably extends from an end of the notch towards the inside of the semiconductor wafer.

Thus, the dislocation extending from the end of the notch comes to lie within the dicing line, so that extension of the dislocation into the integrated circuit is prevented.

The semiconductor wafer according to another aspect of the present invention is secured to a boat during high-temperature processing, and a dicing line is aligned with a defect extending from a contact point of the boat and the semiconductor wafer such that the dicing line overlaps the defect.

In this aspect again, the defect comes to lie within the dicing line, so that the defect is prevented from entering within the integrated circuit.

The dicing line preferably extends from the contact point towards the inside of the semiconductor wafer.

Thus, the dislocation extending from the contact point comes to lie within the dicing line, and extension of the dislocation into the integrated circuit is prevented.

The semiconductor wafer is a silicon wafer of <100> surface orientation and the dicing line is made to extend in a <110> direction.

In the silicon wafer of <100> surface orientation, a dislocation tends to extend in the <100> direction. Thus, by making the dicing line extend in the <100> direction, the dislocation comes to he within the dicing line.

The semiconductor device according to the present invention is formed by cutting the semiconductor wafer along the dicing line.

With the semiconductor wafer as described above, it is possible to effectively prevent extension of a dislocation or the like into an integrated circuit region. Thus, there exist almost no defects as described above in the semiconductor devices (or the integrated circuit chips) obtained by cutting the semiconductor wafer. Therefore, the semiconductor device according to the present invention is highly reliable.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described with reference to FIGS. 1–4.

First Embodiment

Figure 1:
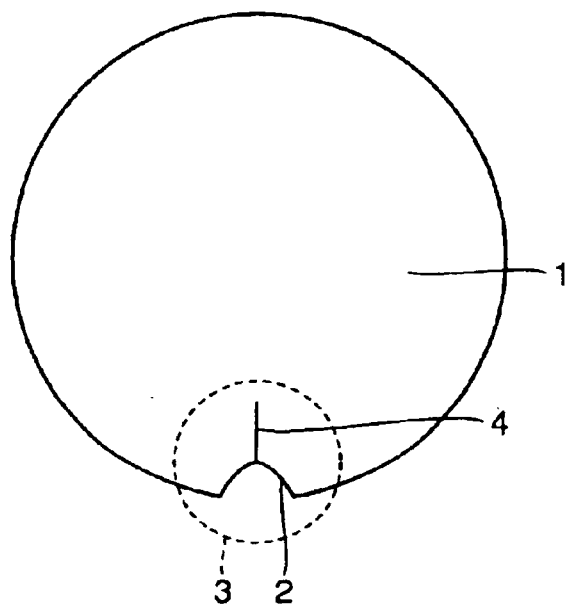
FIG. 1 is a top plan view of a semiconductor wafer according to a first embodiment of the present invention after subjected to high-temperature processing.

Referring to FIG. 1, a silicon wafer 1 according to the first embodiment is a wafer of <100> surface orientation. It has a notch 2 for use in recognizing the crystal surface orientation.

In a device manufacturing process, silicon wafer 1 is subjected to high-temperature processing (for example, heat treatment for impurity diffusion or film formation). In such high-temperature processing, a slip (dislocation) 4 develops at an end of a notch 2 and extends into the wafer.

Figure 2:
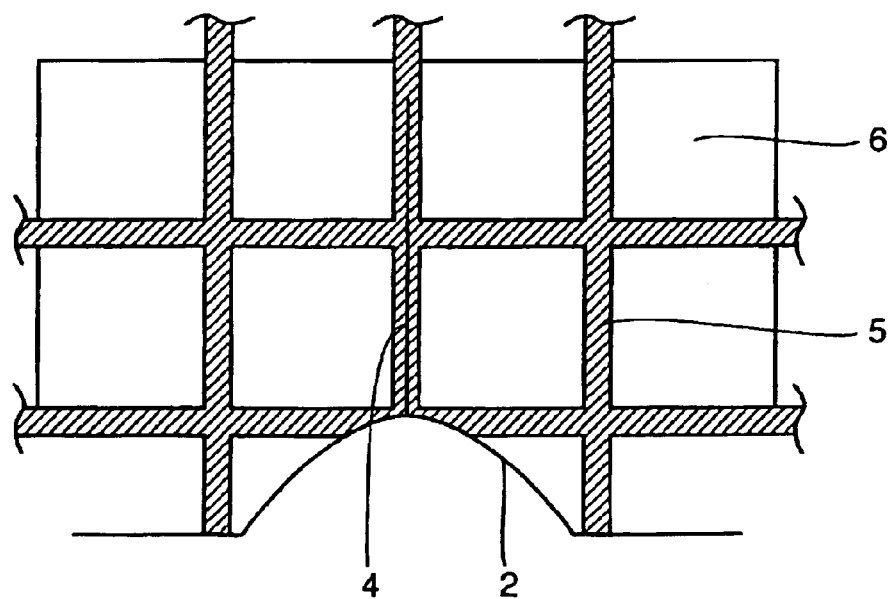
FIG. 2 is an enlarged view of a region 3 in FIG. 1.

Referring to FIG. 2, a large number of integrated circuits 6 are created in silicon wafer 1, and dicing lines (dicing regions) 5 are provided to surround the integrated circuit formation regions 6. A plurality of integrated circuit chips (or semiconductor devices) are obtained by cutting silicon wafer 1 along dicing lines 5.

As shown in FIG. 2, in silicon wafer 1 of <100> surface orientation, slip 4 extends in a <110> direction. Thus, in the present invention, dicing line 5 is made to extend from the end of notch 2 in the <110> direction such that dicing line 5 overlaps the slip 4. In other words, integrated circuits 6 are placed avoiding a region in which slip 4 will be created.

Thus, slip 4 present in silicon wafer 1 extends only within dicing line 5, and is prevented from entering within integrated circuit 6. Accordingly, it is possible to suppress increased leakage, dielectric breakdown or the like due to slip 4 formed in the integrated circuit chip obtained by cutting silicon wafer 1. The yield is thus improved.

Second Embodiment

Figure 3:
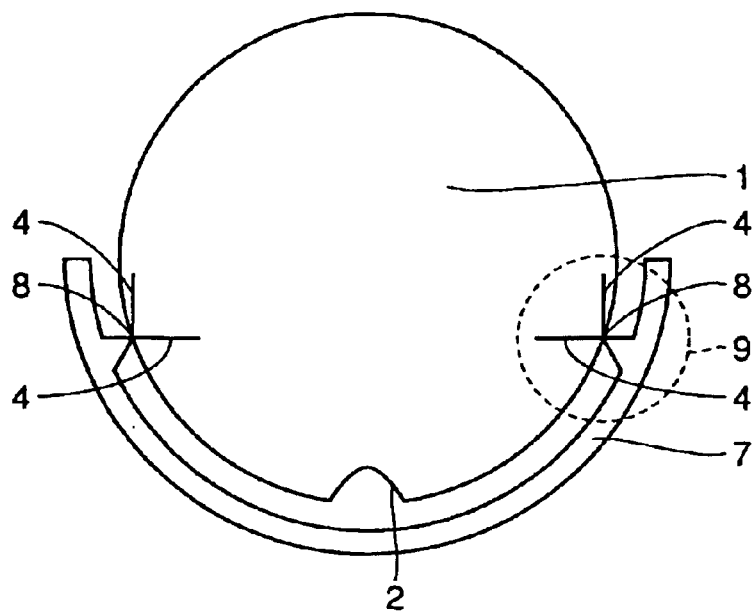
FIG. 3 is a top plan view of a semiconductor wafer according to a second embodiment of the present invention after high-temperature processing.

Now, the second embodiment of the present invention will be described with reference to FIGS. 3 and 4.

In a device manufacturing process, silicon wafer 1 is secured to a member called a boat 7 during high-temperature processing. In this case, as shown in FIG. 3, slip 4 occurs at a contact point 8 of boat 7 and silicon wafer 1. Slip 4 again extends in the <110> direction in silicon wafer 1 of <100> surface orientation.

Figure 4:
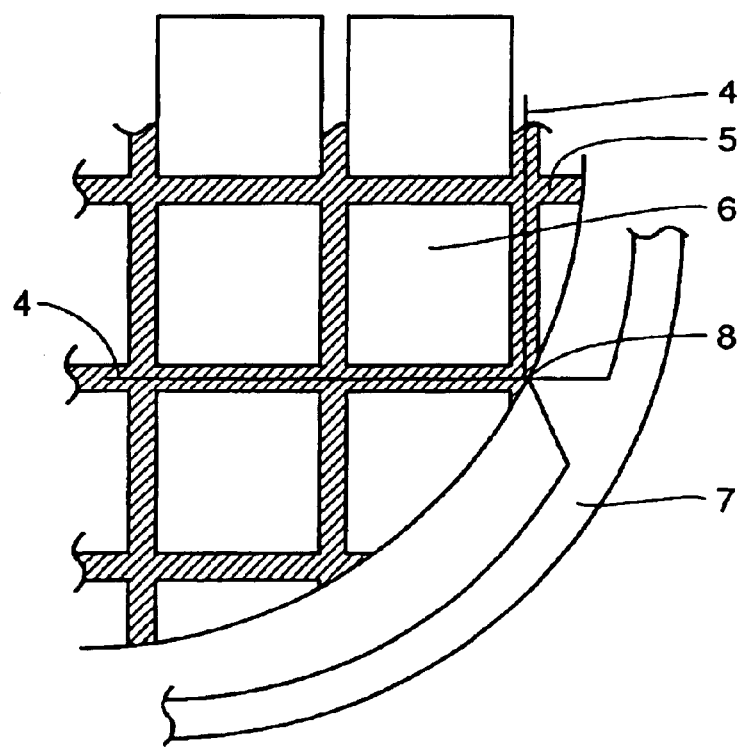
FIG. 4 is an enlarged view of a region 9 in FIG. 3.
Figure 5:
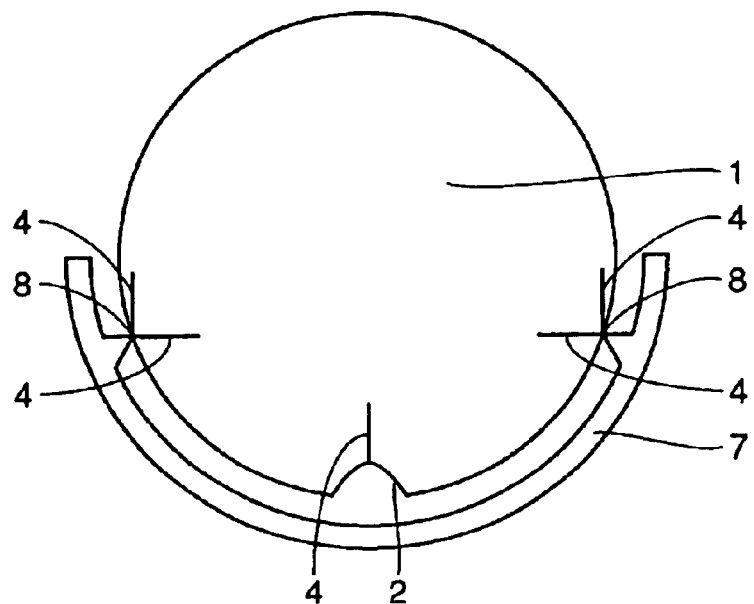
FIG. 5 is a top plan view of a conventional semiconductor wafer after high-temperature processing.
Figure 6:
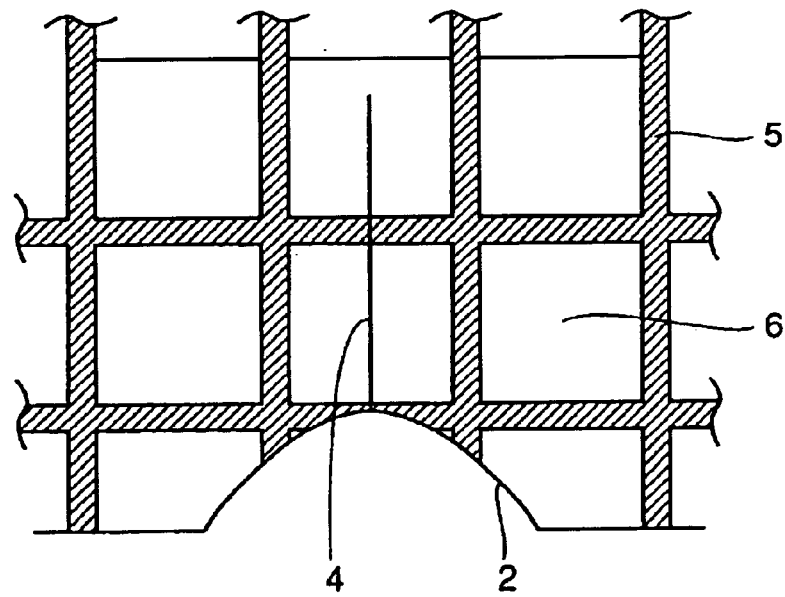
FIG. 6 is an enlarged view of a notch and its neighboring portion in the conventional semiconductor wafer.
Figure 7:
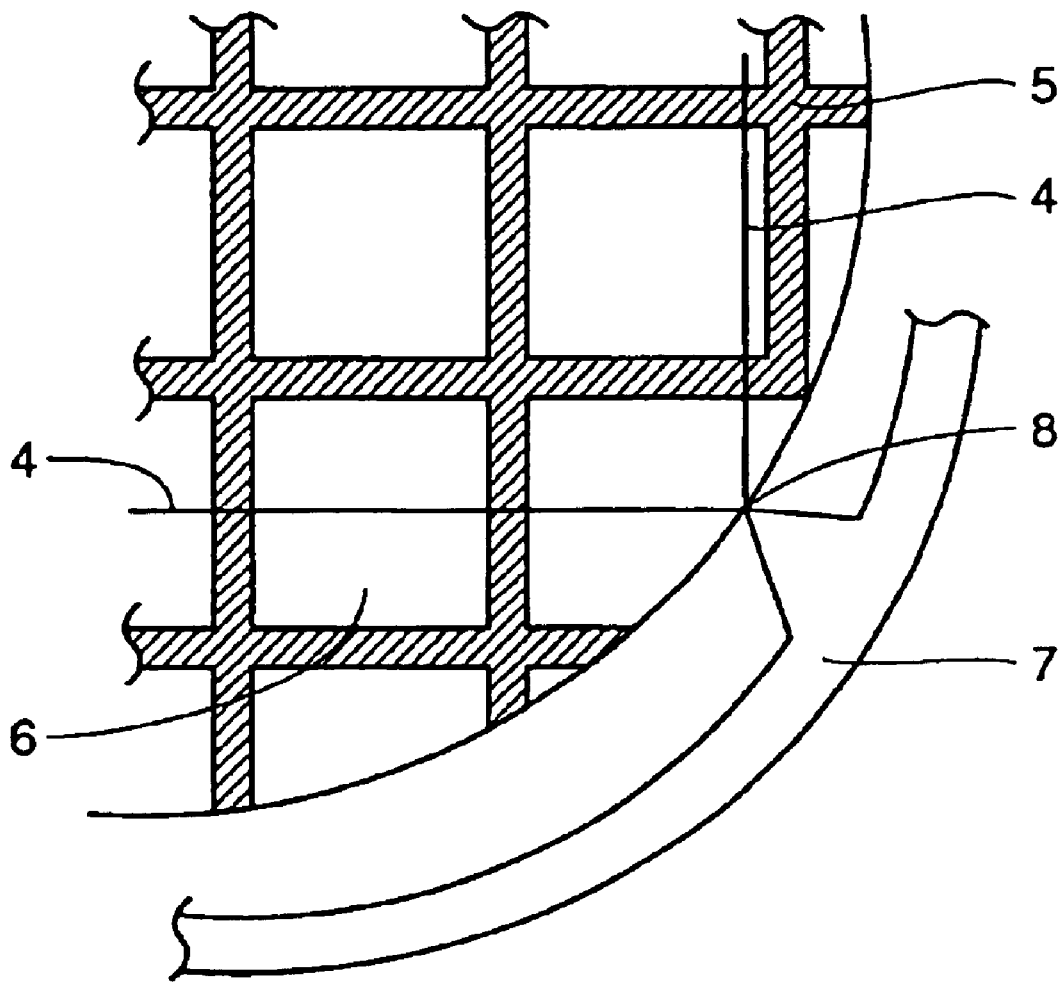
FIG. 7 is an enlarged view of a contact point of a boat and the conventional semiconductor wafer and its neighboring portion.

Therefore, as shown in FIG. 4, dicing line 5 is made to extend from contact point 8 in the <110> direction such that dicing line 5 overlaps the slip 4. Thus, slip 4 extends within dicing line 5, and is prevented from entering within integrated circuit 6.

The concept of the present invention is applicable to a wafer formed of any other semiconductor besides silicon. The present invention is also applicable to any defect generated during any other processing besides the high-temperature processing as long as it is a defect developing at a notch or at a contact point of the boat and the wafer.

As described above, according to the present invention, a defect such as a dislocation that is created, for example, in high-temperature processing is effectively prevented from extending into an integrated circuit formed in a semiconductor wafer. Thus, it is possible to effectively suppress increased leakage or dielectric breakdown due to the occurrence of the defect. The field is thus improved, and a highly reliable semiconductor device is obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor wafer comprising a notch for recognition of crystal surface orientation, a pre-existing defect extending from said notch, and a dicing line, wherein said dicing line is aligned with said pre-existing defect extending from said notch, prior to cutting the wafer, such that the dicing line overlaps the defect.

2. The semiconductor wafer according to claim 1, wherein said dicing line extends from an end of said notch towards an inside of said semiconductor wafer.

3. The semiconductor wafer according to claim 1, wherein said semiconductor wafer is a silicon wafer of <100> surface orientation and said dicing line is extended in a <110> direction.

4. A semiconductor wafer secured to a boat during high-temperature processing comprising a pre-existing defect extending from a contact point of said boat and said semiconductor wafer and a dicing line, wherein said dicing line is aligned with said preexisting defect extending from a contact point of said boat and said semiconductor wafer, prior to cutting the wafer, such that the dicing line overlaps the defect.

5. The semiconductor wafer according to claim 4, wherein said dicing line extends from said contact point towards an inside of said semiconductor wafer.

6. The semiconductor wafer according to claim 4, wherein said semiconductor wafer is a silicon wafer of <100> surface orientation and said dicing line is extended in a <110> direction.

7. The semiconductor wafer according to claim 1, wherein said defect is a crystal dislocation in said semiconductor wafer.

8. The semiconductor wafer according to claim 4, wherein said defect is a crystal dislocation in said semiconductor wafer.

* * * * *